US011522386B2

(12) United States Patent
Rinner et al.

(10) Patent No.: US 11,522,386 B2
(45) Date of Patent: Dec. 6, 2022

(54) ELECTRICAL CIRCUIT AND USE OF THE ELECTRICAL CIRCUIT

(71) Applicant: TDK Electronics AG, Munich (DE)

(72) Inventors: Franz Rinner, Deutschlandsberg (AT); Alexander Melischnig, Graz (AT); Johann Pichler, Breitenau Am Hochlantsch (AT); Masahiro Oishi, Deutschlandsberg (AT)

(73) Assignee: TDK ELECTRONICS AG, Munich (DE)

( * ) Notice: Subject to any disclaimer, the term of this patent is extended or adjusted under 35 U.S.C. 154(b) by 218 days.

(21) Appl. No.: 16/607,272

(22) PCT Filed: May 16, 2018

(86) PCT No.: PCT/EP2018/062773
§ 371 (c)(1),
(2) Date: Oct. 22, 2019

(87) PCT Pub. No.: WO2018/219653
PCT Pub. Date: Dec. 6, 2018

(65) Prior Publication Data
US 2020/0287405 A1 Sep. 10, 2020

(30) Foreign Application Priority Data
May 31, 2017 (DE) .......................... 102017111946.9

(51) Int. Cl.
*H02J 7/35* (2006.01)
*H02S 40/38* (2014.01)
(Continued)

(52) U.S. Cl.
CPC ............. *H02J 7/35* (2013.01); *H01M 10/465* (2013.01); *H02J 7/345* (2013.01); *H02S 40/38* (2014.12)

(58) Field of Classification Search
CPC . H02J 7/35; H02J 7/345; H02S 40/38; H01M 10/465; Y02E 70/30; Y02E 60/10; Y02E 10/50; H01L 31/053
See application file for complete search history.

(56) References Cited

U.S. PATENT DOCUMENTS 3,921,049 A * 11/1975 Mellors ..................... H02J 7/35
320/101
4,465,586 A 8/1984 Diefendorf et al.
(Continued)

FOREIGN PATENT DOCUMENTS

CN 101261047 A 9/2008
CN 102496749 A 6/2012
(Continued)

OTHER PUBLICATIONS

Grady, Steve: "Stromversorgung für am Körper tragbare Technik," http://www.allelectronics.de/stromversorgung-fuer-am-koerper-tragbaretechnik. May 16, 2014, 3 pages.

*Primary Examiner* — Nha T Nguyen
(74) *Attorney, Agent, or Firm* — Slater Matsil, LLP (57) ABSTRACT

An electrical circuit and a method for using the electrical circuit are disclosed. In an embodiment an electrical circuit includes an energy transducer, an energy storage system, a first terminal and a second terminal, wherein the energy transducer is electrically coupled with the first and second terminals, wherein the energy storage system is electrically coupled with the first and second terminals, wherein the energy transducer is configured to charge the energy storage system at discrete time intervals, wherein the energy storage system is configured to provide energy continuously, wherein the energy transducer includes a solar cell, and wherein the energy storage system includes a solid-state storage battery.

20 Claims, 5 Drawing Sheets (51) Int. Cl.
*H01M 10/46* (2006.01)
*H02J 7/34* (2006.01)

(56) References Cited

U.S. PATENT DOCUMENTS

| | | | |
|---|---|---|---|
| 4,740,431 A | 4/1988 | Little | |
| 5,631,535 A | 5/1997 | van der Merwe | |
| 5,986,354 A * | 11/1999 | Nagao | H02J 7/345 |
| | | | 307/64 |
| 11,029,198 B2 * | 6/2021 | Rogers | G01J 1/42 |
| 11,032,895 B1 * | 6/2021 | Sharifipour | H05B 47/19 |
| 2005/0252546 A1 * | 11/2005 | Sasaki | H02S 40/38 |
| | | | 136/243 |
| 2006/0038534 A1 | 2/2006 | Chang et al. | |
| 2007/0181175 A1 * | 8/2007 | Landis | H01L 27/142 |
| | | | 136/252 |
| 2007/0186969 A1 * | 8/2007 | Kohler | H02S 40/34 |
| | | | 136/244 |
| 2008/0001577 A1 * | 1/2008 | Sather | H02J 7/02 |
| | | | 320/162 |
| 2008/0018466 A1 | 1/2008 | Batra et al. | |
| 2008/0224652 A1 * | 9/2008 | Zhu | H02J 7/35 |
| | | | 320/101 |
| 2011/0031925 A1 * | 2/2011 | Simburger | B64G 1/443 |
| | | | 320/101 |
| 2011/0156479 A1 * | 6/2011 | Carroll | H02J 7/35 |
| | | | 307/18 |
| 2014/0034815 A1 * | 2/2014 | Lai | G01J 1/46 |
| | | | 250/214 SW |
| 2014/0103855 A1 * | 4/2014 | Wolter | H01M 10/48 |
| | | | 320/101 |
| 2016/0164146 A1 * | 6/2016 | Na | H01L 24/48 |
| | | | 429/7 |
| 2017/0063297 A1 * | 3/2017 | Chernilevskyy | H02J 3/385 |
| 2017/0075310 A1 * | 3/2017 | Maesawa | G04G 19/00 |
| 2017/0077868 A1 * | 3/2017 | Mishra | G05F 1/67 |
| 2017/0279297 A1 * | 9/2017 | Gao | H02J 7/35 |
| 2018/0152137 A1 * | 5/2018 | Nakamoto | H02J 7/35 |
| 2018/0172751 A1 * | 6/2018 | Takeuchi | H02S 50/10 |
| 2019/0198260 A1 * | 6/2019 | Naka | H02S 40/32 |

FOREIGN PATENT DOCUMENTS

| | | |
|---|---|---|
| CN | 105553417 A | 5/2016 |
| JP | S5127745 A | 3/1976 |
| JP | S52119872 U | 9/1977 |
| JP | S594683 A | 1/1984 |
| JP | S596843 A | 1/1984 |
| JP | S5963672 A | 4/1984 |
| JP | S60118775 U | 8/1985 |
| JP | S62274286 A | 11/1987 |
| JP | H0175285 U | 5/1989 |
| JP | H0252497 A | 2/1990 |
| JP | H0314933 U | 2/1991 |
| JP | H0374999 A | 3/1991 |
| JP | H0759271 A | 3/1995 |
| JP | H07311889 A | 11/1995 |
| JP | 2001135364 A | 5/2001 |
| JP | 2002042863 A | 2/2002 |
| JP | 2008504665 A | 2/2008 |
| WO | 2008005425 A2 | 1/2008 |

* cited by examiner

ELECTRICAL CIRCUIT AND USE OF THE ELECTRICAL CIRCUIT

This patent application is a national phase filing under section 371 of PCT/EP2018/062773, filed May 16, 2018, which claims the priority of German patent application 102017111946.9, filed May 31, 2017, each of which is incorporated herein by reference in its entirety.

TECHNICAL FIELD

The invention relates to electrical circuits, e.g., for electrical systems, which require an autonomous energy supply, and to use of such a circuit.

BACKGROUND

Situations arise in which an electrical circuit has to be supplied with electrical energy at particular positions without a power terminal being present at said point. If, for example, changes are made retrospectively to buildings, power cables may be laid, but the laying of power cables is in general cost- and labor-intensive and may spoil the esthetic appearance.

In order, for example, to arrange and operate a light switch at a point where there is no power supply, a light switch with a radio module may be used, wherein the radio module is supplied with electrical energy by a conventional battery.

Another possibility consists, for example, in using a switch with a magnetic or piezoelectric energy converter, which converts kinetic energy, e.g., energy from the switch actuation motion, into electrical energy (a "harvester"). Such harvesters are, however, costly to acquire and usually also stiffer.

SUMMARY OF THE INVENTION

Embodiments provide electrical circuits which do not differ in operation from conventional circuits, e.g., switches, and in which batteries do not have to be regularly replaced.

In various embodiments the electrical circuit has an energy transducer, an energy storage system, a first terminal and a second terminal. The energy transducer is electrically coupled with the first and second terminals. The energy storage system is likewise electrically coupled with the first and second terminals. The energy transducer is suitable and intended for charging the energy storage system at discrete time intervals. The energy storage system is suitable and intended for providing energy continuously. The energy transducer comprises at least one solar cell. The energy storage system comprises at least one solid-state storage battery.

The first and second terminals are here substantially the two terminals via which the electrical circuit may output electrical energy to further circuit components or to an external circuit environment. The energy transducer with the solar cell is intended for converting electromagnetic energy, preferably in the visible spectrum, into electrical energy. The energy storage system with its solid-state storage battery is intended to receive the energy from the energy transducer at specific time intervals, e.g., when light falls on the solar cell, and to store it temporarily. This means that electrical energy is provided (continuously) at the two terminals even when no light is falling on the solar cell. The electrical circuit has an energy source which also provides energy during darkness.

The solid-state storage battery of the energy storage system is a storage battery design in which the electrodes thereof and the electrolyte between the electrodes consist of a non-liquid material.

Such a solid-state storage battery may be produced with small dimensions and in a multiplicity of different physical forms.

For the user the advantage is achieved that batteries do not have to be regularly replaced. At the same time, no additional space is required and costs are not increased, or are even reduced, in comparison with solutions using magnetic or piezoelectric harvesters.

Actuation of a switch, e.g., a light switch, may also feel like normal switching.

Use of a solid-state storage battery does away with the risk of leaking electrolyte, which often has corrosive characteristics in conventional storage batteries. Moreover, the risk of self-ignition of the solid-state storage battery is also reduced. The storage battery may take virtually any desired form. The mechanical resistance is better than with traditional, conventional batteries or storage batteries, at least if the storage battery is intended to have particularly small dimensions and to this end is designed without a stabilizing outer shell.

Materials which may be used for the electrodes or for the electrolytes are the conventional materials used in solid-state storage batteries.

It is possible for the energy transducer and the energy storage system to be interconnected in parallel.

In a parallel interconnection the energy transducer may charge the energy storage system, e.g., in the case of incident light. Furthermore, both the energy transducer and the energy storage system may together output energy to other circuit components if energy is required and at the same time light is falling on the solar cell of the energy transducer.

It is possible for the electrical circuit additionally to comprise a diode. The diode may be interconnected between the energy storage system and the energy transducer. It is possible for the diode to be interconnected in series between an electrode of the energy storage system and an electrode of the energy transducer.

The diode serves to protect the energy storage system from self-discharge over the energy transducer, e.g., in the case of darkness and finite conductivity of the energy transducer in darkness.

The diode is in this case preferably interconnected such that its own resistance is as low as possible while the energy transducer is charging the energy storage system. The diode is then switched to the non-conducting direction for the opposite current direction.

It is possible for the electrical circuit additionally to have a varistor. The varistor is preferably interconnected in parallel with the energy storage system and in parallel with the energy transducer.

The varistor is a device with a voltage-dependent resistance. The electrical resistance of the varistor decreases as the applied voltage increases.

When the voltage applied is low, the varistor preferably has a very high electrical resistance. In the case of higher voltages, the varistor preferably has a very low electrical resistance.

When using a varistor, the energy storage system may be protected from overload, if for example, the energy transducer, e.g., under strong incident light and with a full energy storage system, or other circuit components are providing excess energy.

The varistor thus serves as overvoltage protection, in particular for the solar cells.

It is possible for the electrical circuit additionally to comprise a resistive element. The resistive element may be interconnected in the energy storage system in series with the solid-state storage battery.

The resistive element, e.g., an ohmic resistor, may thus constitute a series resistor which prevents an excessively high charging current.

It is possible for the electrical circuit additionally to comprise a capacitive element in the energy storage system. The capacitive element may be interconnected in parallel with the solid-state storage battery.

The capacitive element, e.g., a capacitor, may constitute a backup capacitor, which is available to the solid-state storage battery in the event of the provision of electrical energy of a relatively high electrical power, e.g., for an individual switching operation.

Solid-state storage batteries have a comparatively high internal resistance, which is compensated with the capacitor.

It is possible for the energy transducer to comprise three or six solar cells. The solar cells may in this case be series-interconnected. In addition, the energy storage system may comprise one or two solid-state storage batteries, which are series-interconnected.

An individual solar cell may provide a voltage of around 0.5 V, if it receives a corresponding amount of light.

A solid-state storage battery may provide a conventional supply voltage at a level of around 1.5 V, when charged.

A solid-state storage battery with the supply voltage of around 1.5 V may in this case replace conventional batteries with a supply voltage of 1.5 V.

Three solar cells, which are series-interconnected and may each provide an individual supply voltage of 0.5 V, may together provide a supply voltage of around 1.5 V and are thus well suited to charging the solid-state storage battery with a supply voltage of 1.5 V.

The same applies to the associated supply voltage multiples. For example, six series-interconnected solar cells may charge a series interconnection of two storage batteries. Two series-interconnected storage batteries may in this case provide a supply voltage of 3 V. Such an electrical interconnection may constitute a replacement for a power supply with two series-connected conventional batteries.

The electrical circuit may, accordingly, also comprise three, four, five, six, seven, eight, nine or ten solid-state storage batteries and, accordingly, nine, twelve, fifteen, eighteen, 21, 24, 27 or thirty solar cells in the energy storage system.

It is possible for the solid-state storage battery to take the form of a reflow-solderable SMD device. This cannot otherwise be achieved with conventional batteries or storage batteries or only with unduly high technical complexity and corresponding costs.

Reflow soldering is a soft-soldering method for soldering SMD devices. Solid-state storage batteries are well suited to reflow soldering, since the constituents thereof readily withstand the temperatures arising during reflow soldering at least for the relatively short time involved in soldering, without the solid-state storage battery being damaged. The same also applies to the other circuit components of the electrical circuit.

The use of a solid-state storage battery as an SMD device (SMD=Surface-Mounted Device) has the advantage that the storage battery may be readily added to the other circuit components thereof using common (inter)connection technologies and the electrical circuit may accordingly be produced relatively inexpensively and with a low reject rate.

It is possible for at least one circuit component to be embedded in a ceramic multilayer substrate.

A ceramic multilayer substrate has one ceramic layer and one metallization layer. In the case of one or more superposed metallization layers, passive circuit elements, e.g., resistive elements, capacitive elements and/or inductive elements may be formed as metalized structures. The dielectric material of the ceramic layers between the metallization layers serves as an electrical insulator between the metallization layers and as a mechanical carrier which stabilizes the substrate. Different circuit elements in different metallization layers may be (inter)connected together by "vias". Such a ceramic multilayer carrier substrate may have further circuit components, e.g., SMD devices, on its upper side or its lower side.

The ceramic multilayer substrate may, for example, be an LTCC substrate (LTCC=Low-Temperature Co-fired Ceramics) or an HTTC carrier substrate (HTTC=High-Temperature Co-fired Ceramics).

Recesses may be provided in the ceramic carrier substrate in which at least one or more circuit components, e.g., a solar cell or a solid-state storage battery, is embedded.

Through embedding of circuit components, e.g., monolithic embedding of circuit components, in the substrate, the structural height of the corresponding device in which the electrical circuit is produced is reduced.

It is possible for at least two different circuit components to be structurally combined into one module.

More than two circuit components may also be combined into a single module. The circuit components may be monolithically integrated into the module. The module may be SMD-mountable. For example, the solid-state storage battery, the solar cells and further passive circuit components may be combined in a single SMD-mountable module.

It is possible for at least one circuit element to be arranged in a package, the shape and size of which is modeled on the shape and size of a conventional commercial battery, such that the package may be inserted into a holder for such a battery.

This makes it possible for a module in which two or more circuit components are combined to be configured with the external geometry of a battery, e.g., a button cell. Such a module may replace a conventional battery, e.g., a conventional button cell, or at least the receptacle thereof. In existing circuits, therefore, no redesign is necessary.

Dimensioning of the capacity of the energy storage system and of the power of the solar cell may be selected such that conventional requirements are met and manufacturing costs may nevertheless be kept low and dimensions small.

If, for example, a space is illuminated with an LED lamp three meters away and the LED lamp has a power of 10 W and the solar cell has an area of around 4 $cm^2$ and an efficiency of 10%, the output power of the solar cell amounts to around 0.7 µW. If the electrical circuit is a radio light switch and requires an individual switching operation of around 100 µJ, the charging time for an individual switching operation is less than three minutes. The storage capacity of the solid-state storage battery may amount to around 500 mJ. A charged solid-state storage battery thus has sufficient energy for way over a thousand switching operations.

An electrical circuit as described above may accordingly find use as a power supply in an autonomous circuit.

It is possible for the autonomous circuit to be selected from a radio circuit, a light switch, an alarm system, a fire detector, a clock, e.g., a wall clock or a grandfather clock, a remote control, a weather station and a motion detector.

It is possible for the autonomous circuit to be a sensor, e.g., a radio sensor.

It is then possible for the sensor to be configured to detect radiation, pressure, temperature, humidity, the presence of a chemical substance, a gas or acceleration. It is also possible for the sensor to be configured to determine any desired combination of the measured variables associated with these parameters.

A module in which the circuit is provided may have dimensions (length×width) of around 0.305 cm×0.254 cm. Such a module may thus be of very compact construction.

BRIEF DESCRIPTION OF THE DRAWINGS

The functional principles and modes of operation underlying the present electrical circuit and details of preferred embodiments are explained in greater detail in the schematic figures, in which.

DETAILED DESCRIPTION OF ILLUSTRATIVE EMBODIMENTS

Figure 1:
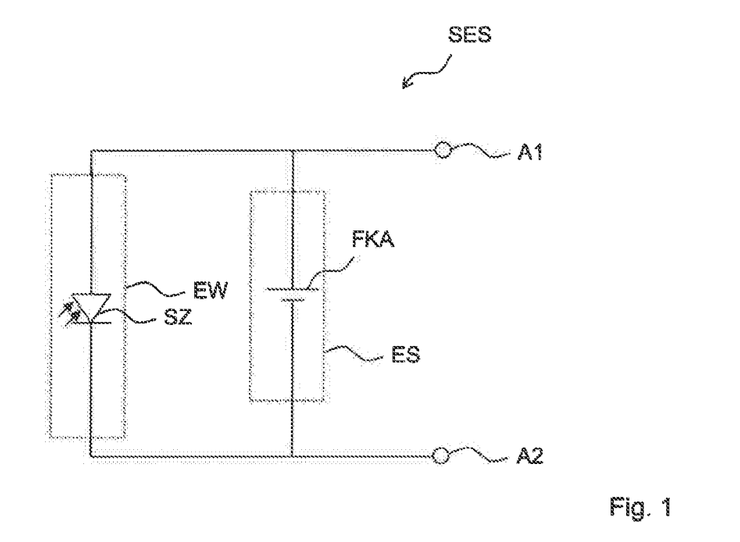
FIG. 1 is an equivalent circuit diagram of a solar-powered electrical circuit.

FIG. 1 shows an equivalent circuit diagram of an electrical circuit with a solar cell, i.e., a solar-powered electrical circuit SES. The circuit has a first terminal A1 and a second terminal A2. An energy transducer EW is electrically coupled between the first terminal A1 and the second terminal A2. The energy transducer EW has at least one solar cell SZ. An energy storage system ES is likewise electrically coupled between the first terminal A1 and the second terminal A2. The energy storage system ES has a solid-state storage battery FKA. The energy storage system EW and the solid-state storage battery FKA are interconnected in parallel with one another between the terminals A1, A2.

The energy storage system ES and the energy transducer EW may be interconnected directly with the two terminals A1 and A2. It is, however, also possible for at least one circuit element, e.g., the energy transducer, to be electrically coupled with just one of the terminals via a further, optional circuit element.

The two terminals A1, A2 constitute a port, via which the energy transducer EW and/or the energy storage system ES may be interconnected with further circuit components of the solar-powered electrical circuit SES. The energy storage system ES here in particular constitutes an energy source, such that the circuit components shown in FIG. 1 may serve as an energy source for the circuit elements, not shown in FIG. 1, of the solar-powered electrical circuit.

The energy transducer EW is intended to charge the energy storage system ES when the energy storage system ES is not fully charged and the energy transducer may receive electromagnetic energy in the form of light via its solar cell. In the case of discrete time intervals, during which the electrical circuit SES is supplied with energy from an external environment, it is nevertheless possible to provide a supply voltage and electrical energy continuously to the terminals A1 and A2.

Figure 2:
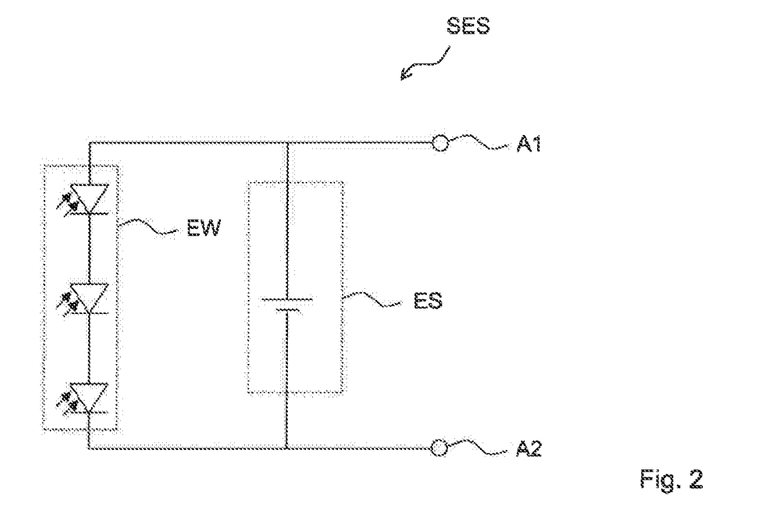
FIG. 2 shows an electrical circuit with three series-interconnected solar cells.

FIG. 2 shows the possibility of interconnecting three solar cells in series in the energy transducer EW. The solid-state storage battery FKA may in this case have a working voltage which corresponds to three times the working voltage of a solar cell. A triple series interconnection of solar cells accordingly adjusts the compatible voltages from energy transducer EW and energy storage system ES to one another.

Figure 3:
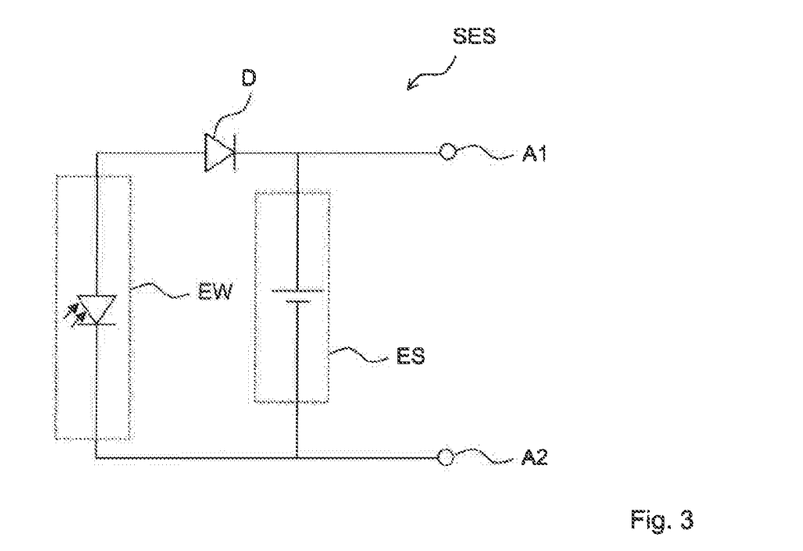
FIG. 3 is an equivalent circuit diagram with a diode.

FIG. 3 shows the use of a diode D interconnected between the energy transducer EW and the energy storage system ES. The diode D serves substantially to prevent discharge of the solid-state storage battery over the solar cells in the case of darkness. To this end, the diode D is connected such that it has a low inherent resistance during charging of the energy storage system and a high electrical resistance in the reverse current direction.

Figure 4:
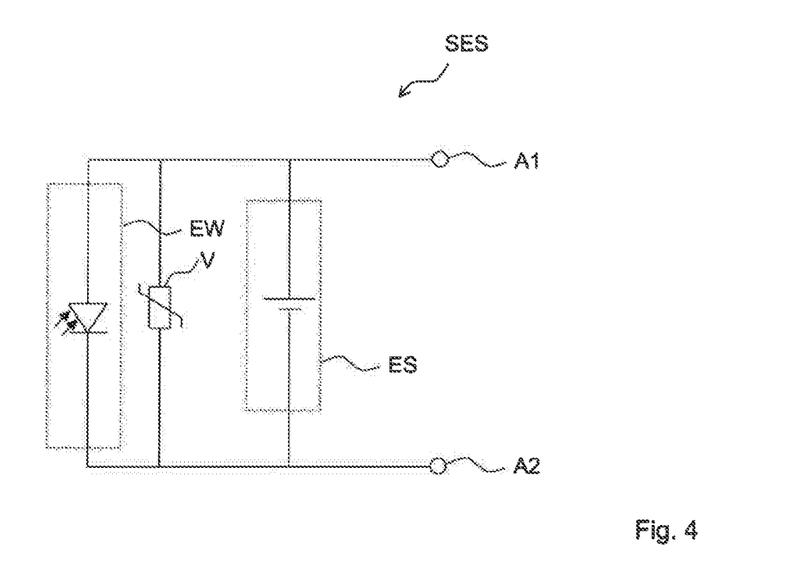
FIG. 4 is an equivalent circuit diagram with a varistor.

FIG. 4 shows the possibility of interconnecting a varistor V in parallel with the energy transducer EW and in parallel with the energy storage system ES. The varistor in this case serves substantially as overvoltage protection for the solar cells or for the energy storage system ES.

Figure 5:
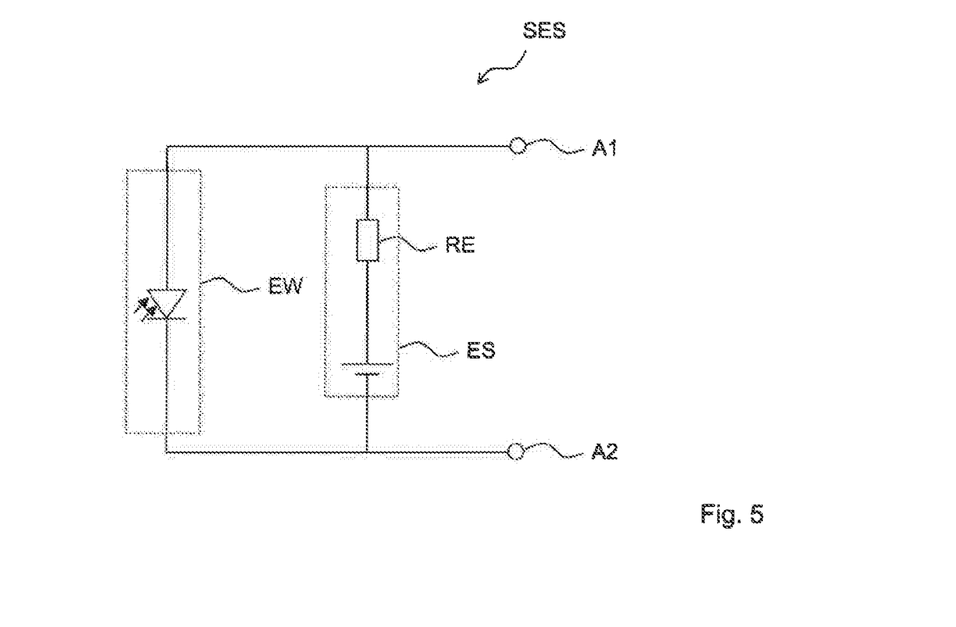
FIG. 5 is an equivalent circuit diagram with a resistive element.

FIG. 5 shows the possibility of interconnecting a resistive element RE, e.g., an ohmic resistor, in series with the solid-state storage battery of the energy storage system ES. The resistive element here substantially constitutes a series resistor which prevents excessively high charging currents.

Figure 6:
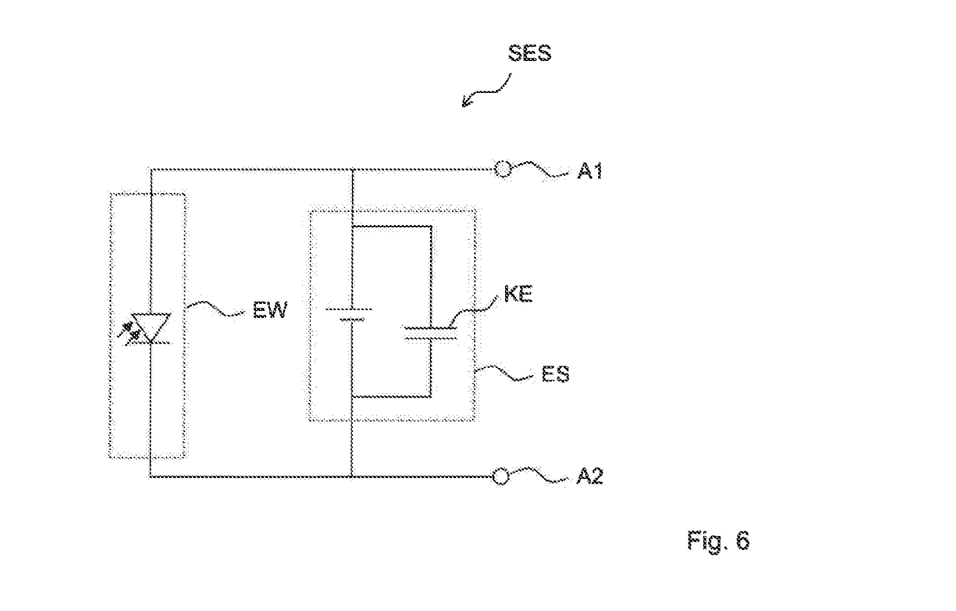
FIG. 6 is an equivalent circuit diagram with a capacitive element.

FIG. 6 shows the possibility of interconnecting a capacitive element KE in parallel with the solid-state storage battery in the energy storage system ES. The capacitive element, e.g., a capacitor, here substantially constitutes a backup capacitor, which assists the solid-state storage battery in providing energy for an individual event. Solid-state storage batteries are substantially characterized by a high energy density and merely a low power density. A low power density may in this case be compensated by use of the backup capacitor. In this way, the electrical circuit has the advantage of high solid-state storage battery energy density without having directly to accept the disadvantage of low storage battery power density.

Figure 7:
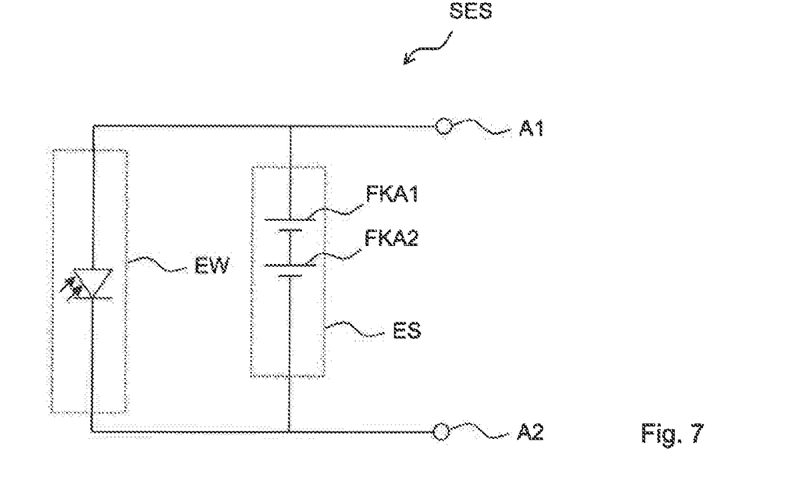
FIG. 7 is an equivalent circuit diagram with two series-interconnected solid-state storage batteries.

FIG. 7 shows the possibility of interconnecting two solid-state storage batteries FKA1, FKA2 in series in the energy storage system ES. By selecting the degree of cascading of a corresponding series or parallel interconnection of individual solid-state storage batteries in the energy storage system ES, it is possible to adapt the electrical circuit to a multiplicity of different requirements with regard to supply voltage or supply current.

The above-disclosed individual features of the circuits may in this case be combined together in such a way that suitable circuit characteristics are retained for a specific instance of application.

Figure 8:
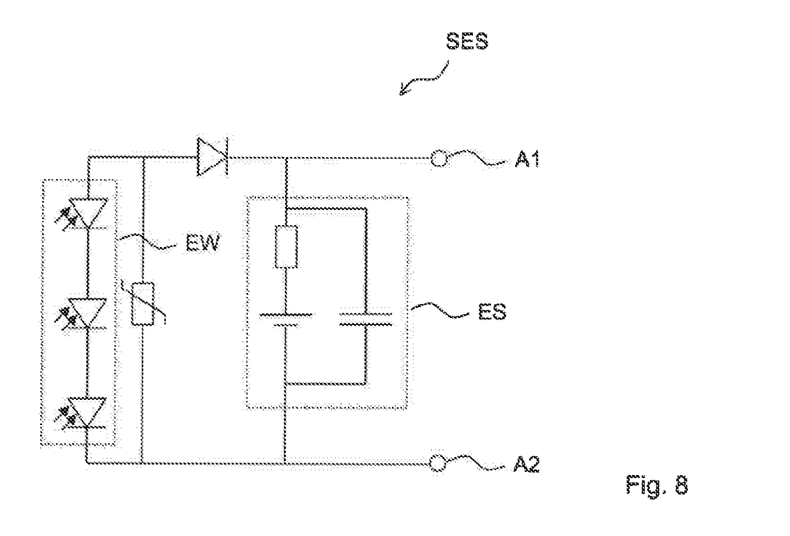
FIG. 8 is an equivalent circuit diagram with a plurality of preferred additional circuit elements.

FIG. 8 accordingly discloses a preferred embodiment with three series-interconnected solar cells in the energy transducer and a resistive and a capacitive element in the energy storage system. The solar-powered electrical circuit SES additionally has a varistor and a diode.

Figure 9:
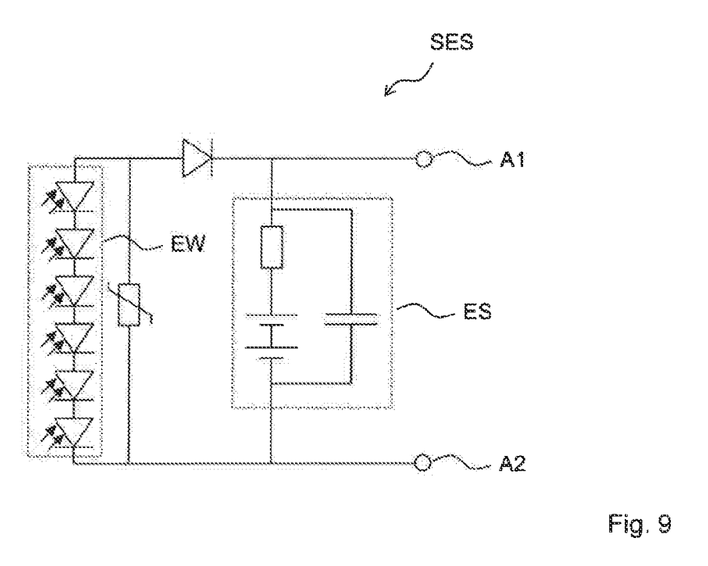
FIG. 9 is an equivalent circuit diagram of a possible configuration of the solar-powered electrical circuit.

FIG. 9 shows a further configuration, in which six solar cells are connected in series in the energy transducer EW to increase the voltage. In the energy storage system ES two storage batteries are connected in series.

The electrical circuit may comprise additional circuit components such as mechanical switches, sensors (e.g., for radiation, pressure, temperature, humidity, chemicals, gases and acceleration), radio modules for receiving or sending electromagnetic signals and further energy transducers and energy storage systems and further passive and active (e.g., integrated electronic circuits for evaluating switching states or sensor measured values or for evaluating or generating received radio signals or radio signals to be sent). Moreover, the electrical circuit may comprise circuit components which may be supplied with electrical energy via the terminals A1, A2.

The invention claimed is:

1. An electrical circuit comprising:
an energy transducer;
an energy storage system; and
a first terminal and a second terminal,
wherein the energy transducer is electrically coupled with the first and second terminals,
wherein the energy storage system is electrically coupled with the first and second terminals,
wherein the energy transducer is configured to charge the energy storage system at discrete time intervals,
wherein the energy storage system is configured to provide energy,
wherein the energy transducer comprises a solar cell,
wherein the energy storage system comprises a solid-state storage battery,
wherein two or more circuit elements are arranged in a package, a shape and a size of which is modeled on a shape and a size of a conventional commercial battery such that the package is insertable into a battery holder, and
wherein the package contains the solid-state storage battery.

2. The electrical circuit according to claim 1, wherein the energy transducer and the energy storage system are interconnected in parallel.

3. The electrical circuit according to claim 1, further comprising:
a diode interconnected between the energy storage system and the energy transducer.

4. The electrical circuit according to claim 1, further comprising:
a varistor interconnected in parallel with the energy storage system and in parallel with the energy transducer.

5. The electrical circuit according to claim 1, further comprising:
a resistive element in the energy storage system, which is interconnected in series with the solid-state storage battery.

6. The electrical circuit according to claim 1, further comprising:
a capacitive element in the energy storage system, which is interconnected in parallel with the solid-state storage battery.

7. The electrical circuit according to claim 1,
wherein the energy transducer comprises three or six solar cells, which are series-interconnected, and
wherein the energy storage system comprises one or two solid-state storage batteries, which are series-interconnected.

8. The electrical circuit according to claim 7, wherein at least one solid-state storage battery is a reflow-solderable SMD device.

9. The electrical circuit according to claim 1, wherein at least one circuit component is embedded in a ceramic multilayer substrate.

10. The electrical circuit according to claim 1, wherein at least two different circuit components are structurally combined into one module.

11. A method for using the electrical circuit according to claim 1, the method comprising:
using the electrical circuit as a power supply in an autonomous circuit.

12. The method according to claim 11, wherein the autonomous circuit is a radio circuit, a light switch, an alarm system, a fire detector, a clock, a remote control, a weather station or a motion detector.

13. The method according to claim 11, wherein the autonomous circuit is a sensor or a radio sensor.

14. The method according to claim 13, wherein the sensor is configured to detect radiation, pressure, temperature, humidity, a presence of a chemical substance, a gas or acceleration or a combination thereof.

15. The electrical circuit according to claim 1, further comprising:
a diode interconnected between the energy storage system and the energy transducer; and
an autonomous circuit,
wherein at least one circuit component is embedded in a ceramic multilayer substrate, and
wherein the autonomous circuit is a radio circuit, a light switch, an alarm system, a fire detector, a clock, a remote control, a weather station or a motion detector.

16. The electrical circuit according to claim 1, further comprising:
a diode interconnected between the energy storage system and the energy transducer; and
a sensor configured to detect radiation, pressure, temperature, humidity, a presence of a chemical substance, a gas or acceleration or a combination thereof,
wherein at least one circuit component is embedded in a ceramic multilayer substrate.

17. The electrical circuit according to claim 1, wherein the shape and the size of the conventional commercial battery is a shape and a size of a button cell.

18. An electrical circuit comprising:
an energy transducer;
an energy storage system; and
a first terminal and a second terminal,
wherein the energy transducer is electrically coupled with the first and second terminals,
wherein the energy storage system is electrically coupled with the first and second terminals,
wherein the energy transducer is configured to charge the energy storage system at discrete time intervals,
wherein the energy storage system is configured to provide energy,
wherein the energy transducer comprises a solar cell,
wherein the energy storage system comprises a solid-state storage battery,
wherein two or more circuit elements are arranged in a package, a shape and a size of which is modeled on a shape and a size of a conventional commercial battery such that the package is insertable into a battery holder, and
wherein the shape and the size of the conventional commercial battery is a shape and a size of a button cell.

19. The electrical circuit according to claim 18, further comprising:
- a diode interconnected between the energy storage system and the energy transducer; and
- an autonomous circuit,
- wherein at least one circuit component is embedded in a ceramic multilayer substrate, and
- wherein the autonomous circuit is a radio circuit, a light switch, an alarm system, a fire detector, a clock, a remote control, a weather station or a motion detector.

20. The electrical circuit according to claim 18,
- wherein the energy transducer comprises six solar cells, which are series-interconnected, and
- wherein the energy storage system comprises two solid-state storage batteries, which are series-interconnected.

* * * * *

UNITED STATES PATENT AND TRADEMARK OFFICE
CERTIFICATE OF CORRECTION

PATENT NO. : 11,522,386 B2
APPLICATION NO. : 16/607272
DATED : December 6, 2022
INVENTOR(S) : Franz Rinner et al.

It is certified that error appears in the above-identified patent and that said Letters Patent is hereby corrected as shown below:

In the Claims

Claim 1, Column 7, Line 29; insert --continuously-- following "energy".

Signed and Sealed this
Seventeenth Day of January, 2023

Katherine Kelly Vidal
*Director of the United States Patent and Trademark Office*